(12) United States Patent
Chen et al.

(10) Patent No.: US 6,177,334 B1
(45) Date of Patent: Jan. 23, 2001

(54) MANUFACTURING METHOD CAPABLE OF PREVENTING CORROSION OF METAL OXIDE SEMICONDUCTOR

(75) Inventors: Tung-Po Chen, Taichung; Yung-Chang Lin, Feng-Yuan; Jacob Chen, Hsinchu, all of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/203,024

(22) Filed: Dec. 1, 1998

(51) Int. Cl.[7] ..................................... H01L 21/20

(52) U.S. Cl. .................. 438/584; 438/592; 438/595; 438/655; 438/306; 438/303

(58) Field of Search .................... 438/584, 592, 438/303, 595, 306, 655

(56) References Cited

U.S. PATENT DOCUMENTS 6,001,718 * 12/1999 Katata et al. ................... 438/592
6,001,719 * 12/1999 Cho et al. ...................... 438/592

* cited by examiner

*Primary Examiner*—Charles Bowers
*Assistant Examiner*—Thanh Nguyen
(74) *Attorney, Agent, or Firm*—Hickman, Coleman & Hughes, LLP

(57) ABSTRACT

A manufacturing method is capable of preventing corrosion of a metal oxide semiconductor. The manufacturing method sequentially forms a polysilicon layer, a silicide layer and a top cap layer over a substrate, and then etching to form a gate structure. Next, a rapid thermal process is carried out to form an oxide layer over the exposed sidewalls of the silicide layer. Finally, the substrate is cleaned, and then of a source/drain region having a lightly doped drain structure is formed on each side of the gate.

7 Claims, 6 Drawing Sheets

MANUFACTURING METHOD CAPABLE OF PREVENTING CORROSION OF METAL OXIDE SEMICONDUCTOR

BACKGROUND OF THE INVENTION

1. Field of Invention

The present invention relates to a manufacturing method capable of preventing the corrosion of a metal-oxide-semiconductor (MOS). More particularly, the present invention relates to a manufacturing method that uses a protective oxide layer capable of preventing corrosion during subsequent cleaning operations.

2. Description of Related Art

A MOS transistor is an important semiconductor device in an integrated circuit. The MOS transistor acts like a switch that can be switched ON or OFF through its voltage. Since the MOS transistor is a major component in the operation of the VLSI circuit, any deviation in the components' voltage sensitivity can lead to serious control problems.

FIGS. 1A through 1C are schematic, cross-sectional views showing the progression of manufacturing steps according to a conventional method of producing a MOS device.

First, as shown in FIG. 1A, a gate oxide layer 12 is formed over a silicon substrate 10. Then, a polysilicon layer 13 is deposited over the gate oxide layer 12. Next, a silicide layer 14 is formed over the polysilicon layer 13. Thereafter, a top cap layer 15 is deposited in sequence over the silicide layer 14.

Next, as shown in FIGS. 1B and 2, photolithographic and etching operations are conducted to pattern a gate structure 18. The gate structure 18 is composed of a gate oxide layer 12, polysilicon layer 13, silicide layer 14 and top cap layer 15.

Next, as shown in FIGS. 1C and 2, subsequently, using the top cap layer 15 as a mask, a first ion implantation is carried out, implanting ions into the substrate 10 to form lightly doped source/drain regions 16.

Thereafter, as shown in FIGS. 1D and 2, spacers 17 are formed on the sidewalls of the gate structure 18. Finally, using the gate structure 18 and the spacers 17 as masks, a second ion implantation is carried out, again implanting ions into the substrate to form heavily doped source/drain regions 11.

In general, the silicide layer 14 is formed using tungsten silicide. However, the tungsten silicide layer has some disadvantages as follows:

(1) Threshold voltage is affected: In a dual gate CMOS transistor, the P-type ions in the P-type gate and the N-type ions in the N-type gate can cross-diffuse into each other through the tungsten silicide layer in the thermal process. This cross-diffusion of different type ions causes a serious shift in the threshold voltage.

(2) Resistance is affected: The tungsten silicide has a higher sheet resistance which induces a serious delay in the response time of the MOS and reduces the operating speed of the integrated circuit.

For at least the reasons described above, titanium silicide is used to replace the tungsten silicide and to improve the yield of the MOS. However, a thin layer of polymer is formed on the surface of the substrate 10, after the ion implantation step is performed. The thin polymer layer reduces the electric sensitivity between the gate, drain region, and source region. Therefore, it is necessary to remove this thin polymer layer by using strong acidic etchant, such as hydrogen fluoride solution. Unfortunately, corrosion occurs on the silicide layer 14 during the removal process, as seen in FIG. 3 which seriously reduces the resistance of the gate.

SUMMARY OF THE INVENTION

Accordingly, the present invention provides a method for manufacturing MOS that is capable of preventing acid corrosion. The method includes using a protective oxide layer to prevent the corrosion effect and to improve the yield.

To achieve these and other advantages and in accordance with the purpose of the invention, as embodied and broadly described herein, the invention provides a method for manufacturing a MOS gate capable of preventing acid corrosion. The manufacturing method includes the steps of sequentially forming a polysilicon layer, a silicide layer and a top cap layer over a substrate, and then etching to form a gate structure. Next, a rapid thermal process is carried out to form an oxide layer over the exposed sidewalls of the silicide layer. Next, the substrate is cleaned followed by the formation of a source/drain region having a lightly doped drain structure on each side of the gate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
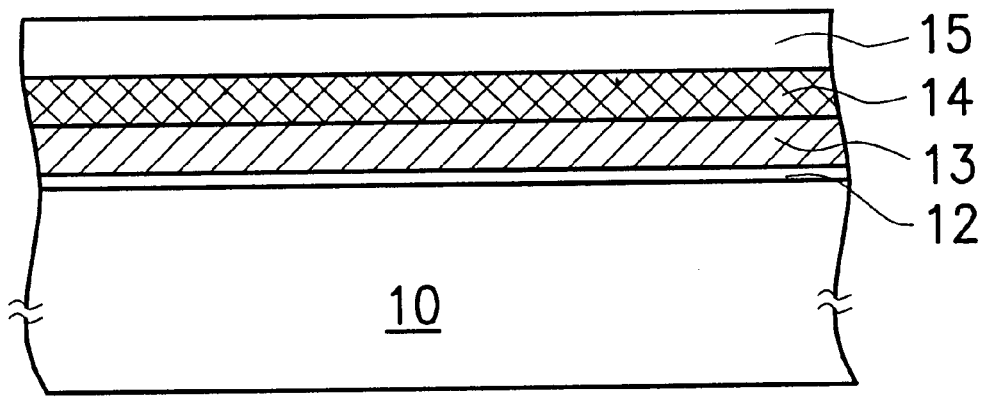
FIGS. 1A through 1D are schematic, cross-sectional views showing the progression of manufacturing steps according to a conventional method of producing a MOS device.
Figure 1B:
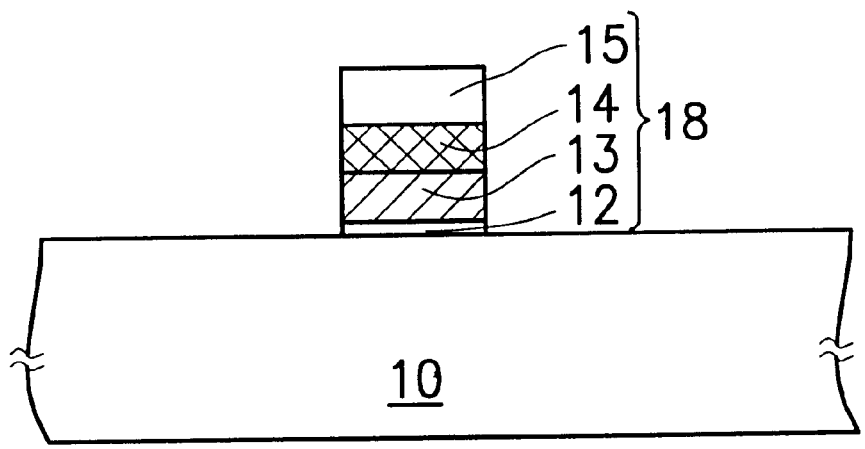
Figure 1C:
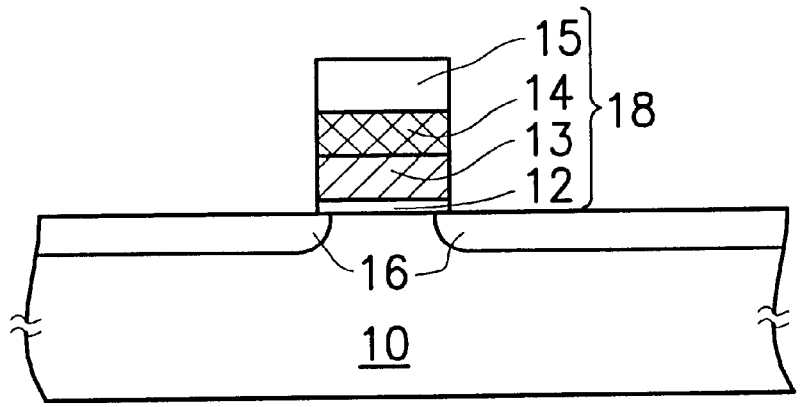
Figure 1D:
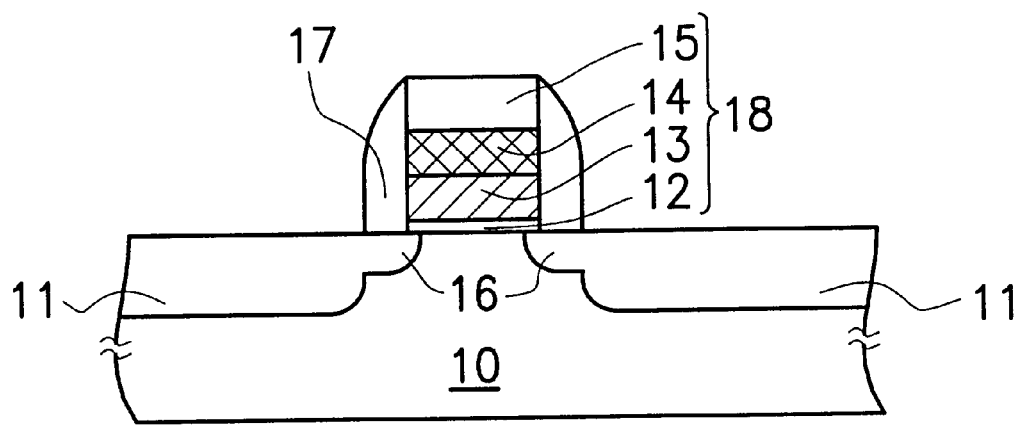
Figure 2:
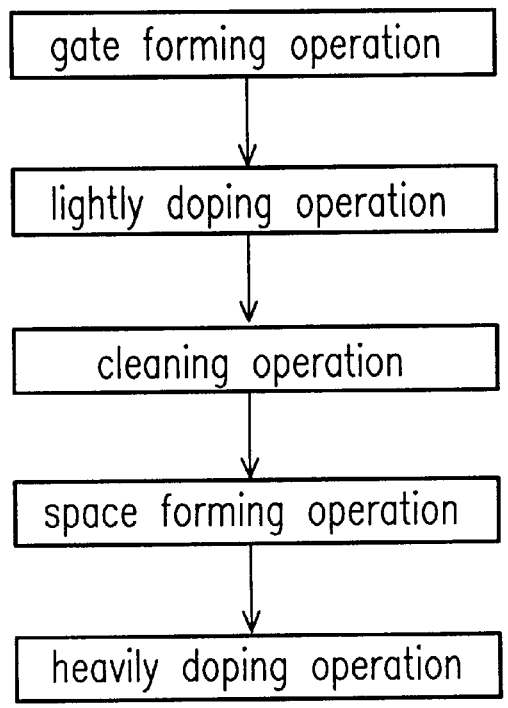
FIG. 2 is a flow chart showing the steps in manufacturing a MOS device according to a conventional method of producing a MOS device.
Figure 3:
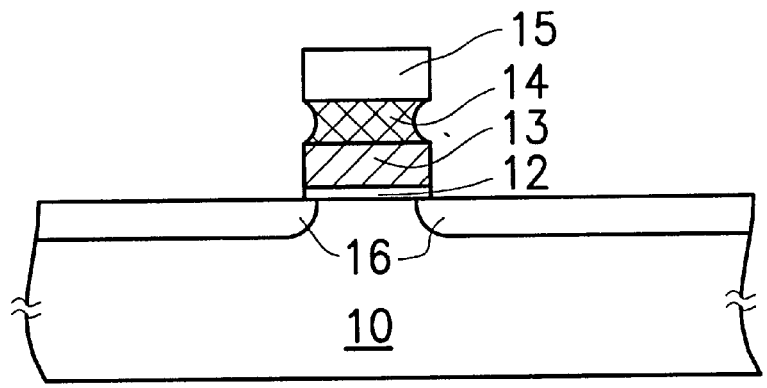
FIG. 3 is a schematic, cross-sectional view indicating the position of corrosion on the sidewalls of a silicide layer in a MOS gate.

Reference will now be made in detail to the present preferred embodiments of the invention, examples of which are illustrated in the accompanying drawings. Wherever possible, the same reference numbers are used in the drawings and the description to refer to the same or like parts.

FIGS. 4A through 4E are schematic, cross-sectional views showing the progression of manufacturing steps for fabricating a MOS device according to the preferred embodiment of this invention. FIG. 5 is a flow chart showing the steps in manufacturing a MOS device according to this invention.

Figure 4A:
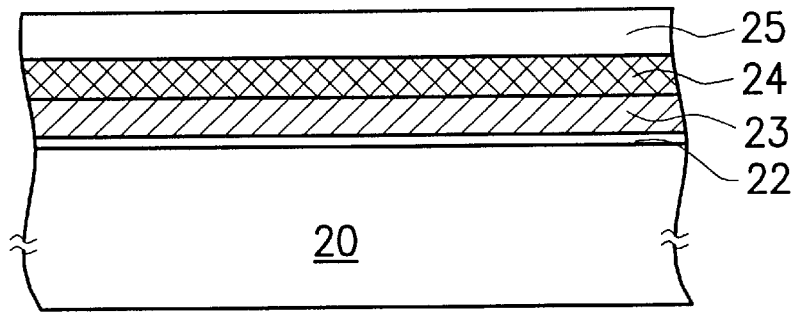
FIGS. 4A through 4E are schematic, cross-sectional views showing the progression of manufacturing steps for fabricating a MOS device according to the preferred embodiment of this invention.
Figure 5:
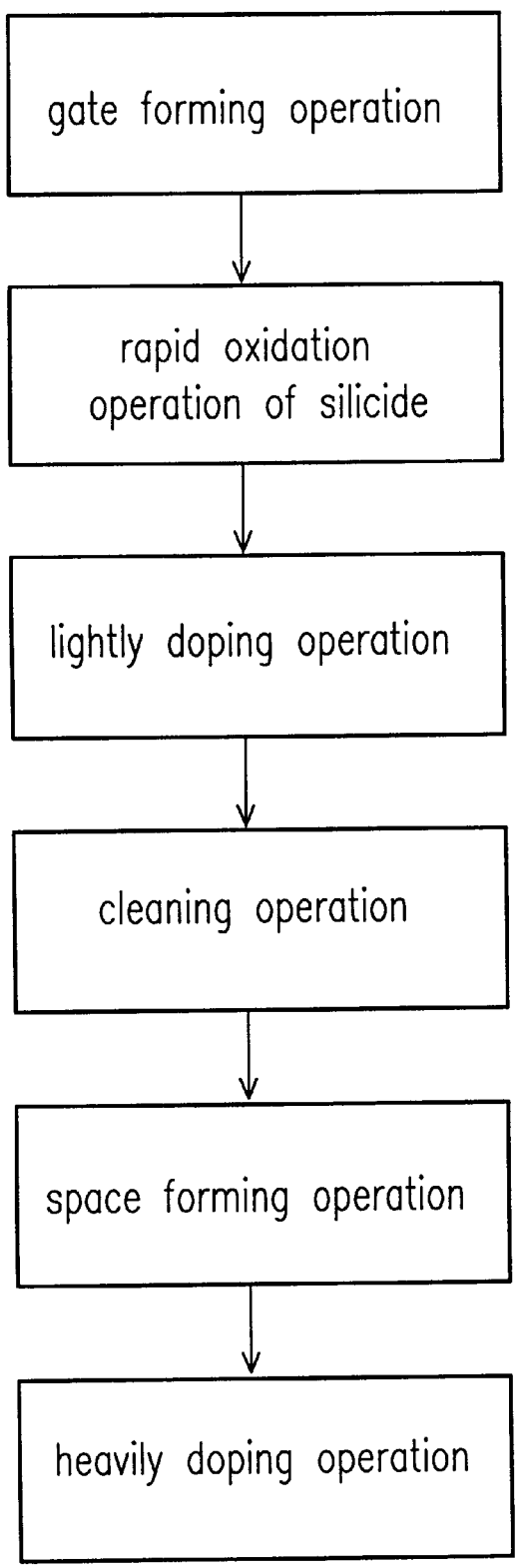
FIG. 5 is a flow chart showing the steps in manufacturing a MOS device according to this invention.

As shown in FIGS. 4A and 5, a gate oxide layer 22 having a thickness of between about 20 Å and 300 Å is formed over a substrate 20, for example, a silicon substrate. The gate oxide layer 22 can be directly grown over the substrate 20 using a thermal oxidation method. Then, a polysilicon layer 23 having a thickness of between about 1000 Å and 2000 Å is formed over the gate oxide layer 22. The polysilicon layer 23 can be formed by using a chemical vapor deposition (CVD) method. Next, a silicide layer 24 is formed over the polysilicon layer 23 using, for example, a chemical vapor deposition (CVD) method. Then, a top cap layer 25 that is slightly thicker than the silicide layer 24 is deposited over the silicide layer 24. The silicide layer 24 can be a titanium silicide layer, or a tungsten silicide layer, or a molybdenum silicide layer formed by a physical vapor deposition (PVD) method such as sputtering or chemical vapor deposition (CVD). The top cap layer 25 can be a silicon nitride layer similarly formed by using a chemical vapor deposition (CVD) method.

Figure 4B:
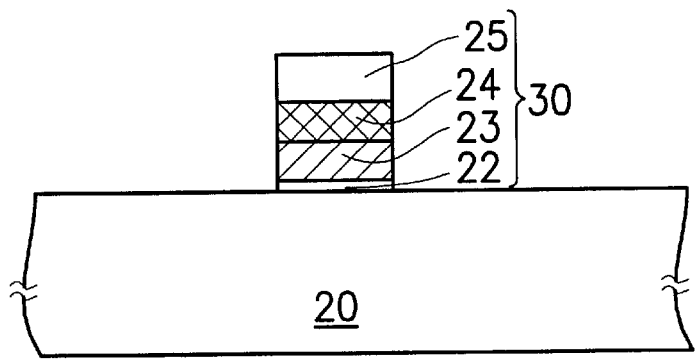

As shown in FIGS. 4B and 5, photolithographic and etching operations are conducted to pattern a gate structure 30. The gate structure 30 is composed of a gate oxide layer 22, polysilicon layer 23, silicide layer 24, and top cap oxide layer 25.

Figure 4C:
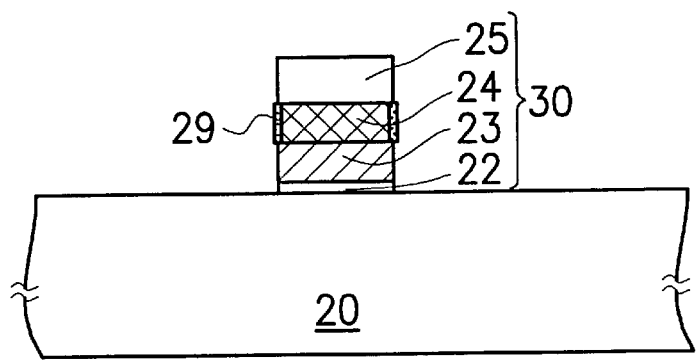

As shown in FIGS. 4C and 5, the MOS device undergoes a rapid thermal processing (RTP) operation. The RTP is carried out at a high temperature and in an oxygen-filled atmosphere. The substrate 20 is heated to a temperature of between about 400° C. and 850° C. and remains there for about 10 to 60 seconds. Consequently, thin oxide layers 29 having a thickness of between about 50 Å and 150 Å are formed on the sidewalls of the exposed silicide layer 24. If the silicide layer 24 is a titanium silicide layer, the thin oxide layer 29 is a titanium oxide layer with the composition of $TiO_2$. Since the silicide layer 24 has an overall width of about 0.25 $\mu$m, the thickness of the thin oxide layer is relatively small. Hence, the conductivity of the MOS gate is little affected by the thin oxide layers 29. Subsequently, using the top cap layer 25 as a mask, a first ion implantation is carried out, implanting ions into the substrate 20 on each side of the gate structure 30 to form lightly doped source/drain regions 27. After that, unwanted thin polymer layer over the substrate 20 formed in previous deposition operations is removed through an etch-cleaning operation. The thin oxide layers 29 on the sidewalls of the silicide layer 24 serves as a barrier blocking any contaminants from leaving through acid corrosion.

Figure 4D:
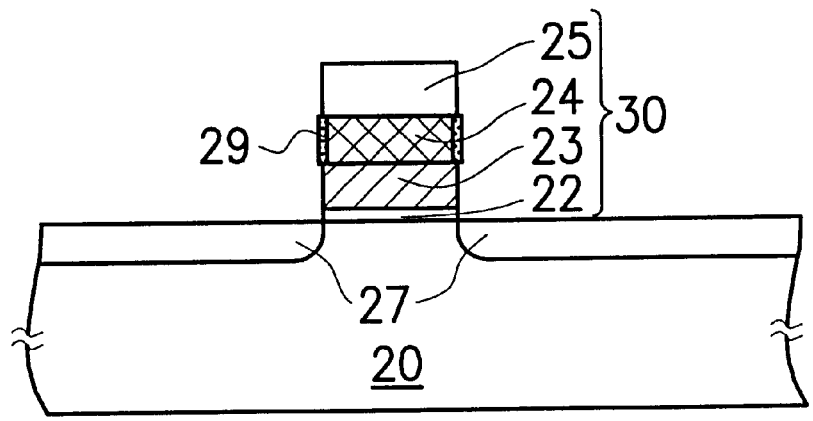
Figure 4E:
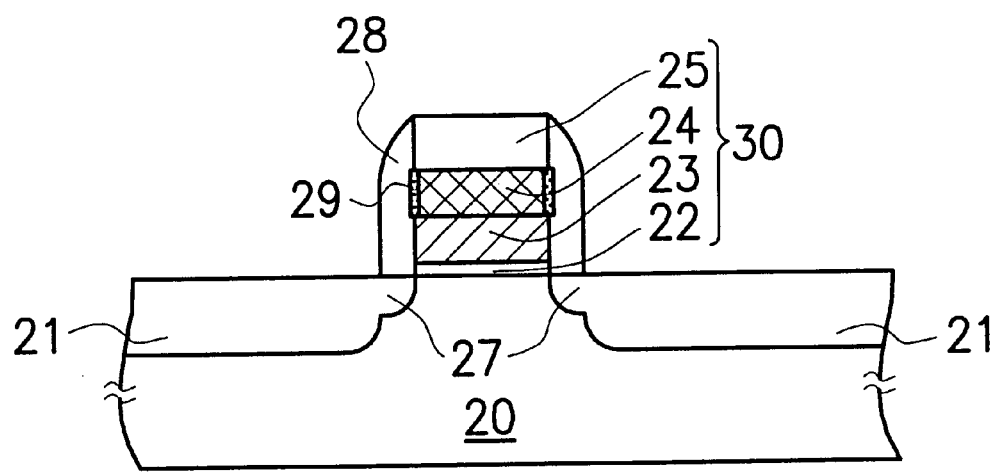

As shown in FIGS. 4D and 5, a thick oxide layer (not shown) is deposited over the substrate 20 and the gate structure 30. Then, the thick oxide layer is etched back to form spacers 28 on the sidewalls of the gate structure 30. Finally, using the top cap layer 25 and the spacers 29 as a mask, a second ion implantation is carried out, implanting ions into the substrate 20 again to form heavily doped source/drain regions 21. The lightly doped source/drain regions 27 and the heavily doped source/drain region 21 together constitute a lightly doped drain (LDD) structure. In the aforementioned illustration, ion implantation is conducted twice to form the LDD structure. However, if the LDD structure is not required, then just one implantation is needed to form the source/drain region. In that case, the RTP operation can be carried out before the single ion implantation.

In summary, the invention employs a rapid thermal processing operation to form an oxide layer 29 over the exposed sidewalls of the silicide layer 24. The thin oxide layer 29 does not cause any observable decrease in MOS gate conductivity because it occupies only a tiny fraction of area at the periphery of the silicide layer 24. Nevertheless, the thin oxide layer 29 is capable of protecting the silicide layer 24 against acid corrosion during subsequent cleaning operations, such as etching cleaning operations, of the unwanted thin polymer layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method capable of preventing corrosion of metal oxide semiconductor, comprising the steps of:

providing a silicon substrate;

forming a gate oxide layer over the substrate;

forming a polysilicon layer over the gate oxide layer;

forming a silicide layer over the polysilicon layer;

forming a cap layer over the silicide layer;

etching the cap layer, the silicide layer, the polysilicon layer and the gate oxide layer to form a gate structure;

performing a rapid oxidation reaction to form a thin oxide layer only on the exposed sidewalls of the silicide layer before any cleaning operation whereby no corrosion occurs on the patterned silicide layer; and performing an ion doping and a cleaning operation.

2. The method of claim 1, wherein the step of performing the oxidation reaction includes heating to a temperature of between about 400° C. and 850° C.

3. The method of claim 1, wherein the step of performing the oxidation reaction includes carrying out the oxidation reaction for about 10 to 60 seconds.

4. The method of claim 1, wherein the step of forming the silicide layer includes depositing a titanium silicide.

5. The method of claim 4, wherein the thin oxide layer is titanium oxide layer.

6. The method of claim 4, wherein the thin oxide layer has a thickness of between about 50 Å and 150 Å.

7. The method of claim 5, wherein the thin oxide layer has a thickness of between about 50 Å and 150 Å.

* * * * *